United States Patent
Giroud et al.

(10) Patent No.: US 9,277,656 B2
(45) Date of Patent: Mar. 1, 2016

(54) METHOD TO FABRICATE A SUBSTRATE INCLUDING A MATERIAL DISPOSED ON THE EDGE OF ONE OR MORE NON THROUGH HOLE FORMED IN THE SUBSTRATE

(71) Applicant: COMMISSARIAT A L'ENERGIE ATOMIQUE ET AUX ENE ALT, Paris (FR)

(72) Inventors: Sophie Giroud, Saint-Egreve (FR); Christine Ferrandon, Sassenage (FR)

(73) Assignee: Comissariat a l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/551,977

(22) Filed: Nov. 24, 2014

(65) Prior Publication Data

US 2015/0156890 A1 Jun. 4, 2015

(30) Foreign Application Priority Data

Nov. 29, 2013 (FR) ...................................... 13 61828

(51) Int. Cl.
*H05K 3/46* (2006.01)
*C23F 1/04* (2006.01)
(Continued)

(52) U.S. Cl.
CPC .. *H05K 3/46* (2013.01); *C23F 1/04* (2013.01); *H01L 23/10* (2013.01); *H01L 23/26* (2013.01); *H01L 23/3121* (2013.01); *H01L 2924/0002* (2013.01)

(58) Field of Classification Search
None
See application file for complete search history.

(56) References Cited

U.S. PATENT DOCUMENTS 7,736,929 B1 * 6/2010 Monadgemi .......... B81B 7/0038
216/11
2002/0070421 A1 6/2002 Ashburn et al.
(Continued)

FOREIGN PATENT DOCUMENTS

DE 10 2008 060 796 A1 5/2010
EP 2 197 780 B1 2/2011
(Continued)

OTHER PUBLICATIONS

Lionel Tenchine, et al., "NEG thin films for under controlled atmosphere MEMS packaging" Sensors and Actuators A: Physical 172, 2011, pp. 233-239.

(Continued)

*Primary Examiner* — Allan Olsen
(74) *Attorney, Agent, or Firm* — Oblon, McClelland, Maier & Neustadt, L.L.P.

(57) ABSTRACT

Method for producing a substrate comprising at least one getter material arranged on the walls of at least one blind hole, comprising at least the steps of:
  etching the blind hole through a first face of the substrate,
  depositing a continuous layer of getter material on the whole of the first face of the substrate and at least on the side walls of the blind hole,
  etching part of the layer of getter material located on the first face of the substrate such that said first face of the substrate is no longer covered by the getter material,
  in which the step of etching part of the layer of getter material comprises the implementation of an etching by ion beam machining, or chemical-mechanical planarization or polishing.

12 Claims, 3 Drawing Sheets

(51) Int. Cl.
*H01L 23/10* (2006.01)
*H01L 23/26* (2006.01)
*H01L 23/31* (2006.01)

(56) References Cited

U.S. PATENT DOCUMENTS

| | | |
|---|---|---|
| 2004/0077117 A1 | 4/2004 | Ding et al. |
| 2004/0222082 A1* | 11/2004 | Gopalraja ............. C23C 14/046 204/192.3 |
| 2007/0045103 A1* | 3/2007 | Lee ....................... C23C 14/025 204/192.15 |
| 2007/0262428 A1 | 11/2007 | Summers |
| 2008/0317995 A1 | 12/2008 | Oldsen et al. |
| 2009/0302478 A1* | 12/2009 | Pagaila ................ H01L 21/568 257/774 |
| 2010/0178419 A1 | 7/2010 | Baillin |
| 2010/0193215 A1 | 8/2010 | Baillin |
| 2011/0079425 A1 | 4/2011 | Baillin et al. |
| 2013/0181302 A1 | 7/2013 | Giroud et al. |
| 2014/0037869 A1* | 2/2014 | Petrmichl ............. E06B 3/6612 428/34 |
| 2014/0175590 A1* | 6/2014 | Gooch ................ H01L 31/0203 257/433 |
| 2014/0357006 A1 | 12/2014 | Ben Mbarek et al. |
| 2015/0069539 A1* | 3/2015 | Chan ................... B81C 1/00285 257/417 |

FOREIGN PATENT DOCUMENTS

FR  2 950 876 A1  4/2011
FR  2 967 302 A1  5/2012

OTHER PUBLICATIONS

French Preliminary Search Report issued Aug. 26, 2014, in French Application No. 13 61828 filed Nov. 29, 2013 (with English Translation of Categories of Cited Documents).

* cited by examiner

METHOD TO FABRICATE A SUBSTRATE INCLUDING A MATERIAL DISPOSED ON THE EDGE OF ONE OR MORE NON THROUGH HOLE FORMED IN THE SUBSTRATE

TECHNICAL FIELD AND PRIOR ART

The invention relates to a method for producing a substrate, or wafer, comprising at least one getter material arranged on the walls of at least one blind hole made in the substrate. Such a substrate is advantageously used to carry out an encapsulation of one or more microelectronic devices, for example of MEMS (micro-electro-mechanical system) and/or NEMS (nano-electro-mechanical system) and/or MOEMS (micro-opto-electro-mechanical system) and/or NOEMS (nano-opto-electro-mechanical system) type, in a cavity in which at least one wall is formed by this substrate such that the blind hole(s) in which the walls are covered with the getter material are exposed in the cavity.

Some microelectronic devices, for example of MEMS and/or NEMS and/or MOEMS and/or NOEMS type, have to be encapsulated in a cavity under controlled atmosphere (control of the pressure and/or of the gas or gases present in the atmosphere) to operate correctly. Such an encapsulation is for example carried out via a transfer of a cover, corresponding to a first substrate, onto a support, corresponding to a second substrate, comprising the microelectronic device(s), then a sealing of the cover onto the support. Such a sealing may be carried out with different methods, for example via the use of a bead of eutectic alloy arranged between the support and the cover. During this transfer of cover, the materials of the microelectronic device can degas and degrade the controlled atmosphere in which the device is encapsulated.

To limit this phenomenon of degassing, an additional cavity is generally made in a non-active part of the support and/or the cover. This additional cavity is made such that its volume corresponds at least to the expansion volume of the species degassed during the sealing or during the lifetime of the microelectronic device(s). Nevertheless, to reach a pressure in the cavity below around 1 mbar, such an additional cavity is in general not sufficient.

In order to improve and maintain the vacuum in the cavity, a getter material is generally arranged in the cavity. Such a getter material, often metallic, is able to carry out an absorption and/or an adsorption of gas after having been thermally activated. Such a getter material is deposited on the surface of one of the substrates forming the encapsulation cavity, and usually on the cover. This getter material is generally deposited through a template in order to carry out a localised deposition of one or several portions of getter material. This method of making and structuring of the getter material by template is preferred to a standard microelectronics method implementing a deposition, a lithography and an etching of a layer of getter material because it does not require the implementation of a step of lithography which may be problematic in the presence of deep cavities (depth greater than 10 μm) and being able potentially to contaminate the getter material.

Nevertheless, a deposition of getter material through a template has several drawbacks:
  a high production cost,
  the mountings of the templates are tricky to implement and need to be carried out substrate by substrate, and are thus industrially expensive to carry out,
  the positioning of the template with respect to the zones to be covered with the getter material is tricky which imposes allowing for an important margin in the pattern, or design, of the component for this alignment and takes up space needlessly on the substrate intended to receive the getter material, and thus increases the cost of the component,
  it is necessary to reserve, on the surface of the substrate intended to receive the getter material, zones for laying down the getter material, preferably far from existing structures so as not to generate electrical perturbations, resulting in a consumption of the surface area of the substrate and a high cost.

The document US 2007/0262428 A1 describes a method for producing a cover in which indentation zones are made. A getter material is deposited in a localised manner in each of these indented zones via the use of a template. With such a method, the electrical interconnections thus have to be transferred outside of these indented zones, which reduces the integration density that can be attained with such a method. Furthermore, this method calls upon a mask such as a template, which results in an additional cost for the implementation of this method and limits the possible aspect ratio of the indentations.

DESCRIPTION OF THE INVENTION

There thus exists a need to propose a method for producing a substrate comprising a getter material not having the drawbacks linked to the deposition of a getter material through a mask such as a template, or those linked to the making of a getter material by deposition, lithography and etching.

To do so, an embodiment proposes a method for producing a substrate comprising at least one getter material arranged on the walls of at least one blind hole, comprising at least the steps of:
  etching the blind hole through a first face of the substrate,
  depositing a layer of getter material in a continuous manner on the whole of the first face of the substrate and at least on the side walls of the blind hole,
  etching part of the layer of getter material located on the first face of the substrate such that said first face of the substrate is no longer covered with the getter material.

This method makes it possible to obtain a portion of getter material in the substrate, or wafer, without implementing a step of photolithography or deposition through a template, which makes it possible to avoid the drawbacks described previously linked to such steps. Moreover, the aspect ratio of the blind hole(s) is not limited by the use of a template.

Furthermore, the deposition of the getter material and the etching of the part of the getter material located outside of the blind hole(s) makes it possible to obtain one or several portions of getter material auto-aligned with the blind hole(s), which resolves the problems of tolerance of alignment to provide in the case of a deposition by template, and makes it possible not to consume the surface of the substrate needlessly for the alignment of the template.

This method also makes it possible to position very precisely the getter material on the substrate, and to avoid for example that this getter material is located near to potential electrical contact lines or electrodes, or other elements, present on the first face of the substrate, thereby limiting electrical noises linked to the presence of the getter material.

This method also optimises the use of the surface of the substrate, and more precisely that of the first face of the substrate, by using the side walls of the blind hole(s) and potentially the bottom wall of the or of each of the blind holes to arrange the getter material. The shape and the surface of getter material deposited may thus be optimised.

This method moreover makes it possible to obtain important surface areas or volumes of getter material without increasing the size of the blind hole(s) thanks to the surface area developed on the walls of the blind hole(s).

The blind hole(s) may be made just before the deposition of the layer of getter material, or earlier during the making of the substrate.

The step of etching part of the layer of getter material comprises the implementation of an etching by ion beam machining, or chemical-mechanical planarization or polishing. Such etching methods make it possible to carry out a local etching of the getter material without resorting to an etching mask, and are compatible with all getter materials.

The layer of getter material may also be deposited on a bottom wall of the blind hole. This part of the layer of getter material deposited on the bottom wall of the blind hole may be conserved and thus not be etched during the step of etching part of the layer of getter material, which makes it possible to increase the surface area of getter material on the substrate.

The step of etching part of the layer of getter material may be implemented such that the getter material deposited on the bottom wall of the blind hole is also etched.

According to a first variant of embodiment, the method may further comprise, between the step of etching the blind hole and the step of depositing the layer of getter material, a step of depositing a protective dielectric layer on the first face of the substrate and at least on the side walls of the blind hole, the layer of getter material then being deposited on the protective dielectric layer. This protective dielectric layer may serve as etching stop layer during the implementation of the step of etching part of the layer of getter material. Furthermore, this protective dielectric layer makes it possible to protect potential structures or elements, for example electrical lines or electrical contact elements, present on the first face of the substrate, for example towards the deposited getter material and/or the etching implemented to eliminate the part of the layer of getter material located on the first face of the substrate. The portions of the protective dielectric layer located on the side walls of the blind hole(s), and potentially on the bottom wall of the or of each of the blind holes, further assure an electrical insulation of the walls on which the protective dielectric layer is located.

The step of etching part of the layer of getter material may also carry out the etching of part of the protective dielectric layer located on the first face of the substrate such that the first face of the substrate is no longer covered with the protective dielectric layer. In this case, portions of the protective dielectric layer are conserved on the side walls of the blind hole(s), and potentially on the bottom wall of the or of each of the blind holes, in order to assure an electrical insulation of these walls.

According to a second variant of embodiment, the method may further comprise, before the step of etching the blind hole, a step of depositing a protective dielectric layer on the first face of the substrate, the blind hole then also being etched through the protective dielectric layer. In this case, the protective dielectric layer may serve as etching stop layer during the implementation of the step of etching part of the layer of getter material located on the first face of the substrate and/or to make it possible to protect potential structures or elements, for example electrical lines or electrical contact elements, present on the first face of the substrate.

The blind hole may comprise, in a plane parallel to the first face of the substrate, a section of circular and/or polygonal shape, or the blind hole may correspond to a trench passing through part of the thickness of the substrate.

The step of etching the blind hole may form several blind holes through the first face of the substrate, and the layer of getter material may be deposited at least on the side walls of the blind holes.

In this case, at least one part of the blind holes may be produced as a regular network of holes. This configuration makes it possible to optimise the surface area occupied by the blind holes at the first face of the substrate. The blind holes may communicate or not together, and may be independent or not of each other.

The method may further comprise, before the step of etching the blind hole, a step of:
    making of at least one microelectronic device on the first face of the substrate, the blind hole(s) being etched next to the microelectronic device, and/or
    making of at least one electrically conductive element on the first face of the substrate, the blind hole(s) being etched next to the electrically conductive element.

The microelectronic device may be of MEMS and/or NEMS and/or MOEMS and/or NOEMS type.

The layer of getter material may comprise at least one of the following elements: titanium, zirconium, aluminium, lanthanum, hafnium, chromium, cobalt, iron, magnesium, manganese, molybdenum, niobium, tantalum, vanadium.

Another embodiment relates to a method of encapsulation of at least one microelectronic device, comprising the implementation of a method for producing a substrate as described previously, and further comprising a step of encapsulation of the microelectronic device in a cavity in which one or several walls are formed by said substrate and such that the blind hole(s) are arranged in the cavity, the microelectronic device being made on said substrate or said substrate forming a cover of the cavity in which the microelectronic device is encapsulated.

BRIEF DESCRIPTION OF THE DRAWINGS

The present invention will be better understood on reading the description of examples of embodiment given for purely indicative purposes and in no way limiting and by referring to the appended drawings in which.

Identical, similar or equivalent parts of the different figures described hereafter bear the same numerical references so as to make it easier to go from one figure to the next.

The different parts shown in the figures are not necessarily shown to a uniform scale in order to make the figures more legible.

The different possibilities (variants and embodiments) must be understood as not being mutually exclusive and may be combined together.

DETAILED DESCRIPTION OF PARTICULAR EMBODIMENTS

Figure 1A:
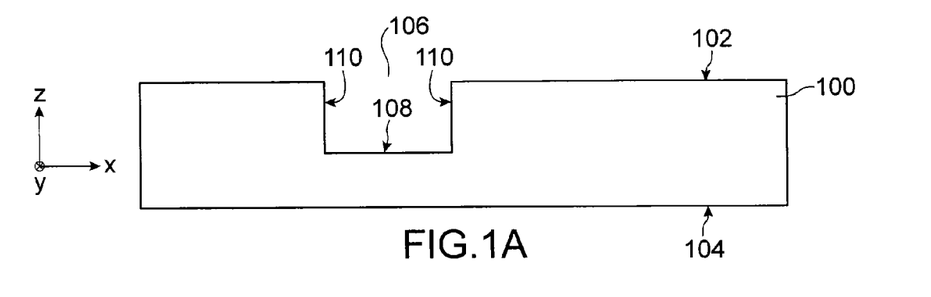
FIGS. 1A to 1C show the steps of a method for producing a substrate comprising a getter material arranged on the walls of at least one blind hole, according to a first embodiment.
Figure 1B:
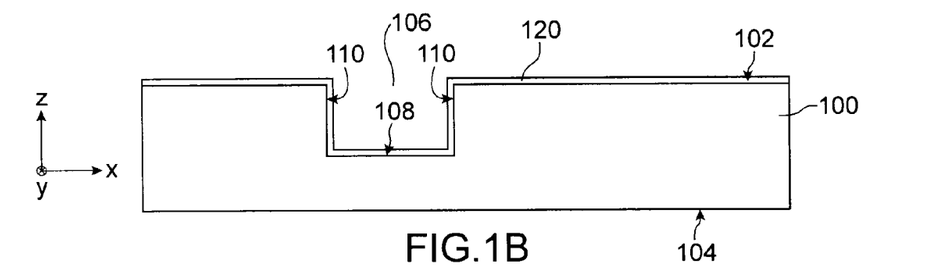
Figure 1C:
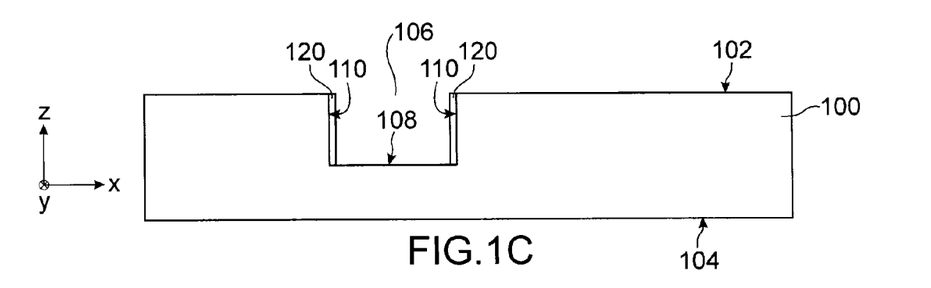

Reference will firstly be made to FIGS. 1A to 1C which show the steps of a method for producing a substrate comprising at least one getter material arranged on the walls of at least one blind hole according to a first embodiment. FIGS. 1A to 1C are profile sectional views of the obtained substrate.

This method is implemented from a substrate 100, here corresponding to a silicon wafer. The substrate 100 may also comprise a material other than silicon, for example another semi-conductor or glass, or instead SiC, or correspond to a stack of several layers. The thickness of the substrate 100 (dimension along the Z axis shown in FIGS. 1A to 1C) is for example greater than around 250 µm in order to have good mechanical strength. This substrate 100 comprises a first main face 102 and a second main face 104 opposite to the first face 102. One or more blind holes 106 are etched through the first face 102 of the substrate 100 and in part of the thickness of the substrate 100 such that the bottom wall(s) 108 of the blind hole(s) 106 are formed by the substrate 100. In FIGS. 1A to 1C, a single blind hole 106 is shown.

The depth of the blind hole(s) 106 is less than the thickness of the substrate 100 and is for example between around 1 µm and several hundred microns, depending on the thickness of the substrate 100. The dimensions of the blind hole(s) 106, in a plane parallel to the first face 102 of the substrate 100, that is to say a plane parallel to the plane (X,Y) shown in FIGS. 1A to 1C, are for example between around 1 µm and several hundreds of microns. The number of blind holes 106 and their dimensions are a function of the surface area of getter material intended to be made on the walls of the blind hole(s) 106 as well as, when the getter material is intended to be exposed to the atmosphere of a cavity in which a microelectronic device is encapsulated, the desired expansion volume in the cavity and thus the desired pressure in the cavity.

Furthermore, the blind hole(s) 106 may have varied shapes and each comprise, for example, in the plane parallel to the first face 102 of the substrate 100, a section of circular shape or of disc shape, or polygonal such as a square or rectangular section. In a variant, the blind hole(s) 106 may correspond to trenches, that is to say comprise, in the plane parallel to the first face 102 of the substrate 100, a shape stretched out along a direction belonging to this plane. The blind hole 106 shown in FIGS. 1A to 1C comprises, in the plane parallel to the first face 102 of the substrate 100, a section of circular shape.

Figure 2:
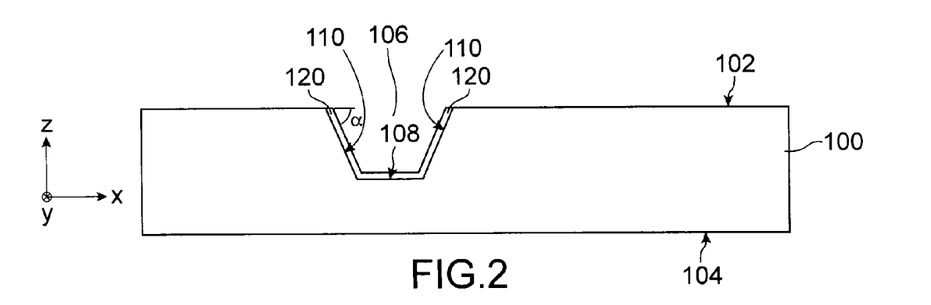
FIG. 2 shows a substrate obtained by the implementation of a production method, according to a variant of the first embodiment.

The blind hole(s) 106 comprise side walls 110. In the example of FIGS. 1A to 1C, these side walls 110 form an angle of around 90° with the first face 102 of the substrate 100, that is to say belong to at least one plane perpendicular to the first face 102 of the substrate 100. According to a variant of embodiment, these side walls may not be perpendicular to the first face 102 of the substrate 100. Thus, as shown in FIG. 2, the side walls 110 of the blind hole(s) 106 form an angle α with the first face 102 of the substrate 100, this angle α being less than 90°, for example between 80° and 90°. The or each of the blind holes 106 has in this case a truncated cone shape, the dimensions of the section of the or of each of the blind holes 106 at the bottom wall 108 being less than those at the first face 102 of the substrate 100. The value of the angle formed by the side walls 110 of the blind hole(s) 106 with the first face 102 of the substrate 100 is chosen especially as a function of the etching method that will be implemented later to remove the getter material located on the first face 102 of the substrate 100, as described hereafter.

Figure 3:
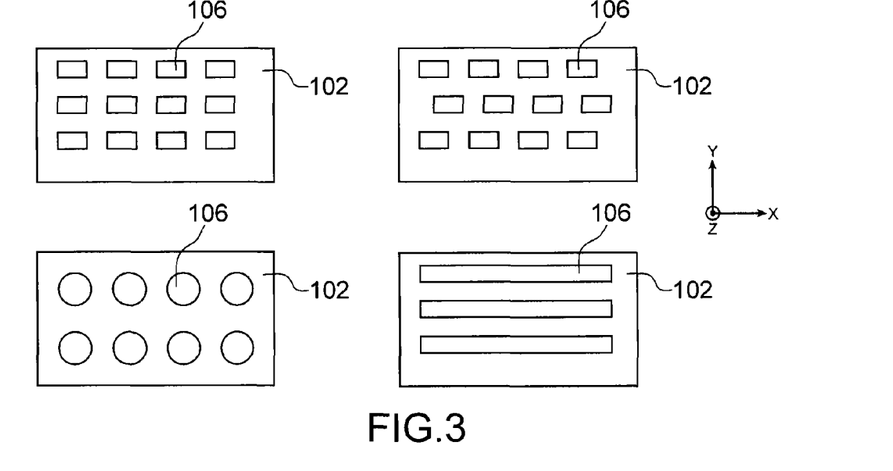
FIG. 3 shows several configurations of blind holes made during the implementation of a method for producing a substrate comprising a getter material arranged on the walls of blind holes.

The shape and the number of blind holes 106 are determined especially as a function of the space available on the first face 102 of the substrate 100 to make the blind hole(s) 106. FIG. 3 shows different examples of making of several blind holes 106 made next to each other through the first face 102 of the substrate 100 (in these different examples, only part of the first face 102 of the substrate 100 is shown). In these examples, the blind holes 106 each have a section, in a plane parallel to the first face 102 of the substrate 100, of circular, rectangular shape, or correspond to trenches. Furthermore, the blind holes 106 are arranged forming a regular network of holes, that is to say are regularly spaced apart, in order to optimise the surface area of the first face 102 of the substrate 100 dedicated to these blind holes 106. This network may have offsets from one line to the next of the network, the blind holes 106 being in this case arranged in staggered rows.

The blind hole(s) 106 are for example made by photolithography and etching depending on the pattern chosen for this or these blind holes(s) 106. The etching of the blind hole(s) 106 may correspond to a dry etching, for example RIE (reactive ion etching) or DRIE (deep reactive ion etching) type, or wet etching, for example with a solution of TMAH (tetra methyl ammonium hydroxide) or KOH (potassium hydroxide) type depending on the nature of the material of the substrate 100 to be etched.

A layer of getter material 120 is then deposited on the substrate 100, that is to say on the first face 102 of the substrate 100 as well as on the side walls 110 and the bottom wall 108 of the or of each of the blind holes 106 (FIG. 1B). The thickness of the layer of getter material 120 is for example between around 100 nm and several microns, or even 10 µm. The deposition of the layer of getter material 120 implemented is preferably conform, that is to say that the thickness of the layer of getter material 120 is substantially constant for the whole of the layer of getter material 120, including at the portions of the layer of getter material 120 located on the side walls 110 of the blind hole(s) 106. A non-conforming deposition of the layer of getter material 120 may also be implemented. For example, if the conformity is low, for example of the order of 30%, the thickness of the layer of getter material 120 deposited may be greater than that chosen for a conforming deposition. To obtain the desired thickness of getter material on the side walls 110, as a function of the deposition technique implemented, the getter material is deposited on the first face 102 of the substrate 100 as well as on the bottom wall 108 of the or of each of the blind holes 106. In a variant, it is possible that the layer of getter material 120 is not deposited on the bottom wall 108 of the or of each of the blind holes 106, especially when the blind hole(s) 106 comprise a low aspect ratio (ratio of the width with respect to the depth of the blind hole). If it is wished to favour the deposition on the bottom walls 108 of the blind holes 106 in the case of blind holes 106 having a large aspect ratio, for example greater than around 10, and of narrow section, for example less than around 100 µm², a deposition of CVD (chemical vapour deposition), ALD (atomic layer deposition) or IBD (ion beam deposition) type is preferably implemented because these types of deposition make it possible to obtain a more uniform, and thus more conforming, deposition.

The layer of getter material 120 may correspond to a single layer or to several layers of materials stacked on top of each other, and for example comprising a metal or a metal alloy comprising for example titanium and/or zirconium and/or aluminium and/or lanthanum and/or hafnium and/or chromium and/or cobalt and/or iron and/or magnesium and/or manganese and/or molybdenum and/or niobium and/or tantalum and/or vanadium. The layer of getter material 120 may be made by implementing methods similar to those described in the documents FR 2 950 876 B1, or "NEG thin films for under controlled atmosphere MEMS packaging" by L. Tenchine et al., Sensors and Actuators a-Physical 172(1) (2011) 233-239. The layer of getter material 120 is for example deposited by PVD (physical vapour deposition), cathodic sputtering, ion gun evaporation or instead by electron beam deposition, the deposition technique implemented depending especially on the nature of the getter material to be deposited. The layer of getter material 120 may also be associated with an activation and/or passivation layer as described in the document EP 2 197 780 B1.

As shown in FIG. 1C, the parts of the layer of getter material 120 located on the first face 102 of the substrate 100 and on the bottom wall 108 of the or of each of the blind holes 106 are then etched such that only the side walls 110 of the blind hole(s) 106 remain covered with the remaining parts of the layer of getter material 120. This etching corresponds for example to an RIE etching or an etching by ion beam machining, or any other technique suited to the removal of these parts of the layer of getter material 120.

In a variant, it is possible that only the parts of the layer of getter material 120 located on the first face 102 of the substrate 100 are etched such that the side walls 110 and the bottom wall 108 of the or of each of the blind holes 106 are covered with the remaining parts of the layer of getter material 120, as shown in FIG. 2. The surface area of getter material located in the blind hole(s) 106 is thereby increased. When only the parts of the layer of getter material 120 located on the first face 102 of the substrate 100 are etched, this etching may be carried out via chemical-mechanical planarization, or chemical-mechanical polishing, with stop on the first face 102 of the substrate 100. Such a chemical-mechanical planarization is preferably implemented to eliminate the parts of the layer of getter material 120 located on the first face 102 of the substrate 100 when the side walls 110 of the blind hole(s) 106 are not perpendicular to the first face 102 of the substrate 100, as in the example of FIG. 2.

Among the different methods of etching the getter material described previously, those chosen preferentially are etching by ion beam machining, chemical-mechanical planarization or polishing. These etching methods are highly directive and, coupled to the blind holes, they make it possible to carry out a local etching of the getter material without the need of a mask. In fact, the making of such an etching mask, for example by photolithography, adds a risk of contamination of the getter material and thus a modification of its performances. Furthermore, the etching methods indicated above are compatible with the etching of all known getter materials, unlike other etching techniques such as RIE which cannot be used to etch Zr for example.

Figure 6:
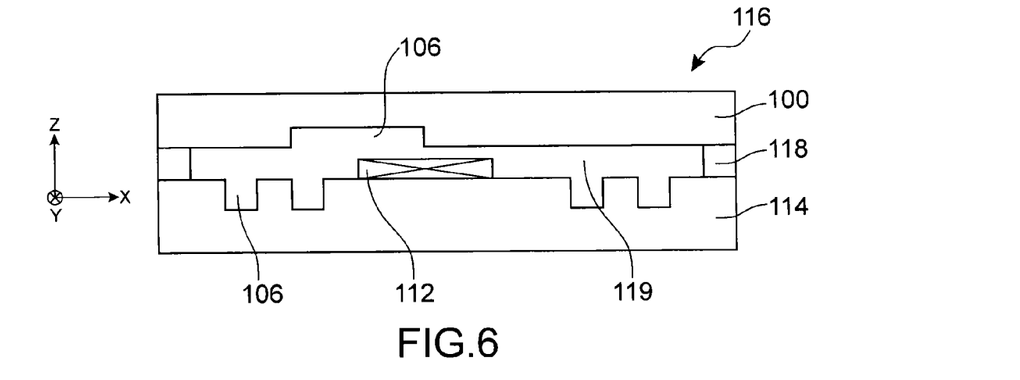
FIG. 6 shows an encapsulation structure obtained by the implementation of a method of encapsulation of a microelectronic device.

In the first embodiment described previously, the substrate 100 is intended to serve as cover during an encapsulation of a microelectronic device 112, that is to say to be transferred onto another substrate 114, called support, on which the microelectronic device 112 is made. This substrate 114 may also comprise blind holes and a layer of getter material as for the substrate 100. The encapsulation structure 116 thereby obtained is shown in FIG. 6, in which the substrate 100 forming the cover is made integral with the substrate forming the support 114 by a bonding interface 118, forming a cavity 119 in which the microelectronic device 112 is encapsulated. Furthermore, although this is not visible in this FIG. 6, the side walls, as well as potentially the bottom walls, of the blind holes 106 are covered with the getter material. In a variant, it is possible that the substrate 100 described previously comprises such a microelectronic device 112 made on its first face 102 and that this substrate 100 then forms the support of the encapsulation structure 116, the blind hole(s) 106 in which the walls are covered with getter material being made next to the microelectronic device 112. Thus, it is possible that one or more blind holes in which the side walls and potentially the bottom walls are covered with the getter material are made in the substrate corresponding to the cover and/or in the substrate corresponding to the support of such an encapsulation structure 116. In all cases, the blind holes 106 are made on the substrate(s) 100, 114 as a function of the space available on the latter.

According to another variant, the substrate 100 may have a function of interposer and be arranged between a cover and a support of an encapsulation structure, or instead be arranged between electronic chips and a support. Moreover, the substrate 100 may comprise, on its first face 102, functionalities such as electrical lines and/or electrical contact elements, and does so whatever the role of the substrate 100 (cover, support or interposer for example).

Figure 4A:
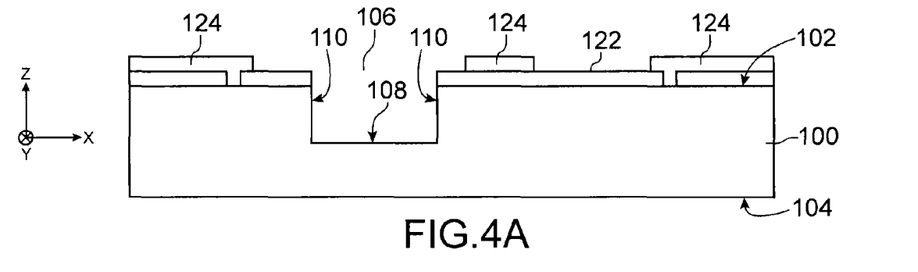
FIGS. 4A to 4C show the steps of a method for producing a substrate comprising a getter material arranged on the walls of at least one blind hole, according to a second embodiment.
Figure 4B:
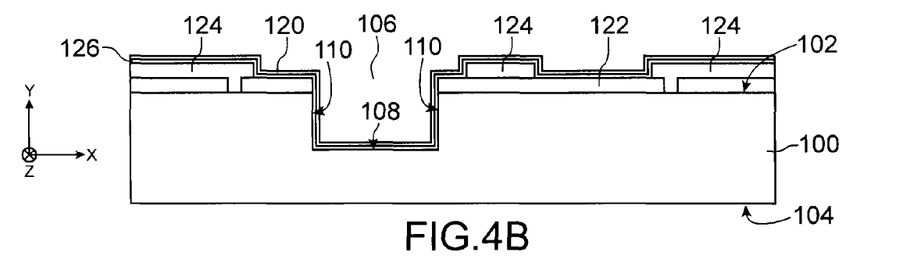
Figure 4C:
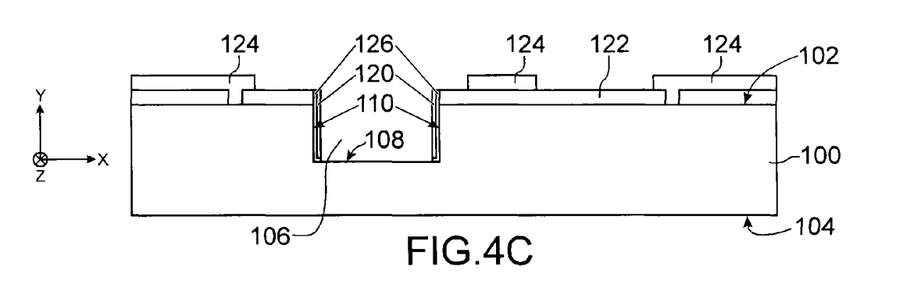

Reference will now be made to FIGS. 4A to 4C which show the steps of an example of method for producing a substrate comprising at least one getter material arranged on the walls of at least one blind hole according to a second embodiment. FIGS. 4A to 4C are profile sectional views of the obtained substrate. In this second embodiment, the substrate 100 is intended to form the support of an encapsulation structure in which a microelectronic device, made on the substrate 100 (not visible in FIGS. 4A to 4C), is encapsulated.

Compared to the substrate 100 described previously in relation with the first embodiment, the substrate 100 according to this second embodiment comprises a first dielectric layer 122, for example $SiO_2$-based, made on the first face 102 of the substrate 100 and making it possible to electrically insulate electrically conductive elements 124, for example AlCu-based, towards the substrate 100. These electrically conductive elements 124 are for example electrodes, electrical lines or instead electrical contact pads, arranged on the first dielectric layer 122 and potentially electrically contacting the substrate 100 through the first dielectric layer 122. In a variant, the elements present on the substrate 100 could be different, corresponding for example to those of a mechanical structure made on the substrate 100.

As described previously in relation with FIG. 1A, one or more blind holes 106 are etched through the first face 102 of the substrate 100 and in part of the thickness of the substrate 100. The blind hole(s) 106 are also etched through the first dielectric layer 122 (FIG. 4A).

Prior to the deposition of the layer of getter material 120, a protective dielectric layer 126 is deposited conformally on the first face 102 of the substrate 100, thereby covering the electrically conductive elements 124 and the first dielectric layer 122, as well as on the side walls 110 and the bottom wall 108 of the or of each of the blind holes 106. The material of the protective dielectric layer 126 is chosen as a function of its compatibility with the materials present (that is to say especially those of the substrate 100, the first dielectric layer 122 and the elements 124), and as a function of the getter material intended to be deposited thereafter. Furthermore, the material of the protective dielectric layer 126 is chosen such that it is resistant to the etching of the getter material that will be implemented later. Thus, the protective dielectric layer 126 comprises for example an oxide, such as $SiO_2$, for example deposited by PECVD (plasma enhanced chemical vapour deposition), and comprises a thickness for example between several tens of nanometers, for example 20 nm, and several microns, for example 9 µm. The layer of getter material 120 is then deposited on the protective dielectric layer 126 (FIG. 4B).

As shown in FIG. 4C, the parts of the layer of getter material 120 and of the protective dielectric layer 126 located on the first face 102 of the substrate 100 (and covering the electrically conductive elements 124 and the first dielectric layer 122) and on the bottom wall 108 of the or of each of the blind holes 106 are then etched such that only the side walls 110 of the blind hole(s) 106 are covered with the remaining parts of the protective dielectric layer 126 and the layer of getter material 120. The etching of these parts of the layer of getter material 120 and the protective dielectric layer 126 is for example carried out by a technique similar to that described previously in relation with the first embodiment to etch the getter material. This etching of the parts of the layer of getter material 120 covering the electrically conductive elements 124 makes it possible to avoid an electrical noise that could be brought about by the presence of the getter material on these electrically conductive elements 124. Furthermore, the parts of the protective dielectric layer 126 located on the side walls 110 of the blind hole(s) assure an electrical insulation of these walls, especially towards the getter material localised on these walls.

In a variant, it is possible that only the parts of the layer of getter material 120 and the protective dielectric layer 126 located on the first face 102 of the substrate 100 are etched such that the side walls 110 and the bottom wall 108 of the or of each of the blind holes 106 are covered with the remaining parts of the layer of getter material 120 and the protective dielectric layer 126. The surface area of getter material located in the blind hole(s) 106 is thereby increased while electrically insulating all of the walls of the blind hole(s) 106 especially towards the getter material. According to another variant, it is possible that only the parts of the layer of getter material 120 located on the first face 102 of the substrate 100, and potentially on the bottom wall 108 of the or of each of the blind holes 106, are etched, the protective dielectric layer 126 being able to be conserved on the bottom wall 108 of the or of each of the blind holes 106 and/or on the first face 102 of the substrate 100.

Figure 5A:
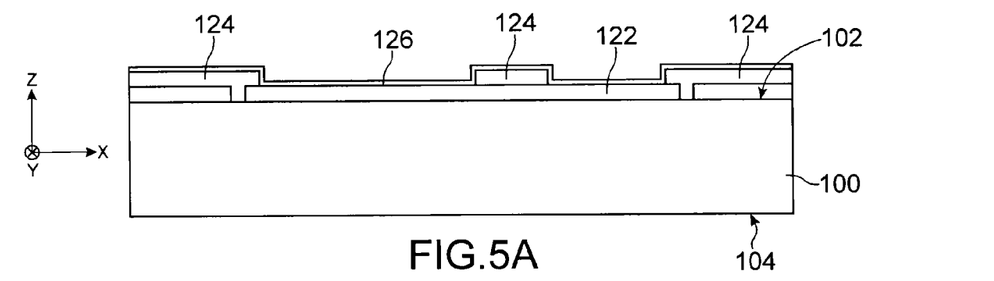
FIGS. 5A to 5C show part of the steps of a method for producing a substrate comprising a getter material arranged on the walls of at least one blind hole, according to a variant of the second embodiment.
Figure 5B:
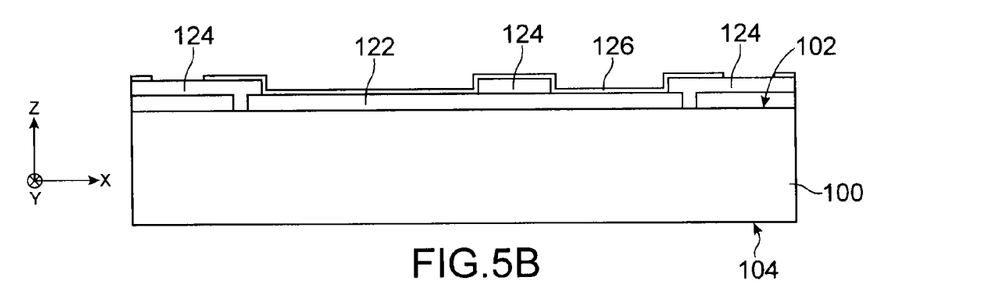
Figure 5C:
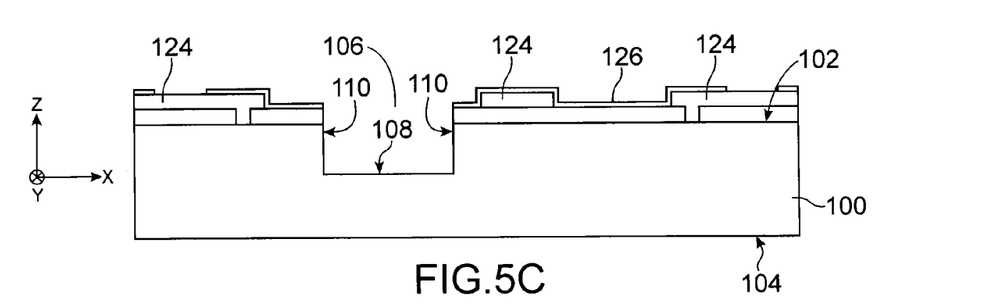

Referring now to FIGS. 5A to 5C which show the steps of a method for producing a substrate comprising at least one getter material arranged on the walls of at least one blind hole according to a variant of the second embodiment described previously.

Unlike the second embodiment described previously in relation with FIGS. 4A to 4C in which the blind hole(s) 106 are made prior to the deposition of the protective dielectric layer 126, the protective dielectric layer 126 is here deposited on the second face 102 of the substrate 100, that is to say on the electrically conductive elements 124 and on the first dielectric layer 122, prior to the making of the blind hole(s) 106 (FIG. 5A).

The protective dielectric layer 126 is then structured by etching in order to only conserve the parts of this protective dielectric layer 126 located on the surfaces to be protected, as shown in FIG. 5B. Moreover, this etching step also makes it possible to form accesses to the electrically conductive elements 124 forming the contact pads. Nevertheless, this step of structuring the protective dielectric layer 126 may be omitted if it is not necessary to make such accesses.

The blind hole(s) 106 are then etched through the protective dielectric layer 126, the first dielectric layer 122 and through the second face 102 of the substrate 100, as described for the preceding examples and embodiments (FIG. 5C). The layer of getter material 120 is then deposited, and then etched as described previously in the preceding examples and embodiments. Thus, the protective dielectric layer 126 assures the protection of the elements located on the first face 102 of the substrate 100.

It is possible that only the parts of the layer of getter material 120 located on the first face 102 of the substrate 100, and potentially on the bottom wall 108 of the or of each of the blind holes 106, are etched, the protective dielectric layer 126 being able to be conserved on the first face 102 of the substrate 100.

In a variant, the elements present on the substrate 100 could be different, corresponding for example to those of a mechanical structure made on the substrate 100.

The different examples and variants described previously in relation with the first embodiment also apply to the second embodiment described in relation with FIGS. 4A to 4C as well as to the variant of embodiment described in relation with FIGS. 5A to 5C. Conversely, the method according to the first embodiment described previously may also be implemented in the presence of the first dielectric layer 122 and/or the electrically conductive elements 124 and/or the protective dielectric layer 126 as described in relation with FIGS. 4A to 4C or 5A to 5C.

The invention claimed is:

1. Method for producing a substrate comprising at least one getter material arranged on the walls of at least one blind hole, comprising at least:
    etching the at least one blind hole through a first face of the substrate,
    depositing a layer of getter material in a continuous manner on the whole of the first face of the substrate and at least on the side walls of the at least one blind hole,
    etching part of the layer of getter material located on the first face of the substrate such that said first face of the substrate is no longer covered by the getter material,
    in which the etching part of the layer of getter material comprises the implementation of an etching by ion beam machining, or chemical-mechanical planarization or polishing.

2. Method according to claim 1, in which the layer of getter material is also deposited on a bottom wall of the at least one blind hole.

3. Method according to claim 2, in which the etching part of the layer of getter material is implemented such that the getter material deposited on the bottom wall of the at least one blind hole is also etched.

4. Method according to claim 1, further comprising, between the etching the at least one blind hole and the depositing the layer of getter material, a depositing a protective dielectric layer on the first face of the substrate and at least on the side walls of the at least one blind hole, the layer of getter material then being deposited on the protective dielectric layer.

5. Method according to claim 4, in which the etching part of the layer of getter material also carries out the etching of part of the protective dielectric layer located on the first face of the substrate such that said first face of the substrate is no longer covered by the protective dielectric layer.

6. Method according to claim 1, further comprising, before the etching the at least one blind hole, a depositing a protective dielectric layer on the first face of the substrate, the at least one blind hole then also being etched through the protective dielectric layer.

7. Method according to claim 1, in which the at least one blind hole comprises, in a plane parallel to the first face of the substrate, a section of circular and/or polygonal shape, or in which the at least one blind hole corresponds to a trench passing through part of the thickness of the substrate.

8. Method according to claim 1, in which the etching the at least one blind hole makes several blind holes through the first face of the substrate, and the layer of getter material is deposited at least on the side walls of the blind holes.

9. Method according to claim 8, in which at least one part of the at least one blind holes are produced as a regular network of holes.

10. Method according to claim 1, further comprising, before the etching the at least one blind hole:
- making of at least one microelectronic device on the first face of the substrate, the at least one blind hole(s) being etched next to the at least one microelectronic device, and/or
- making of at least one electrically conductive element on the first face of the substrate, the at least one blind hole(s) being etched next to the electrically conductive element.

11. Method according to claim 1, in which the layer of getter material comprises at least one of the following elements: titanium, zirconium, aluminium, lanthanum, hafnium, chromium, cobalt, iron, magnesium, manganese, molybdenum, niobium, tantalum, vanadium.

12. Method of encapsulation of at least one microelectronic device, comprising the implementation of a method for producing a substrate according to claim 1, and further comprising encapsulation of the microelectronic device in a cavity in which one or several walls are formed by said substrate and such that the at least one blind hole(s) are arranged in the cavity, the microelectronic device being made on said substrate or said substrate forming a cover of the cavity in which the microelectronic device is encapsulated.

* * * * *